United States Patent [19]

Ishigaki et al.

[11] 4,449,106
[45] May 15, 1984

[54] NOISE REDUCING APPARATUS

[75] Inventors: Yukinobu Ishigaki, Machida; Yutaka Haramoto, Zama; Kaoru Totsuka, Yokohama, all of Japan

[73] Assignee: Victor Company of Japan, Ltd., Yokohama, Japan

[21] Appl. No.: 354,863

[22] Filed: Mar. 4, 1982

[30] Foreign Application Priority Data

Mar. 10, 1981 [JP] Japan ................................. 56-34148
Mar. 23, 1981 [JP] Japan ................................. 56-41976

[51] Int. Cl.³ ............................................. H04B 1/64
[52] U.S. Cl. ...................................... 333/14; 381/106; 455/72
[58] Field of Search ........................... 333/14; 455/72; 381/106, 71; 330/144, 129, 132, 134, 279

[56] References Cited

U.S. PATENT DOCUMENTS

| | | | | |
|---|---|---|---|---|
| 4,101,849 | 7/1978 | Blackmer et al. | ............... | 330/132 X |
| 4,281,295 | 7/1981 | Nishimura | ................... | 333/14 |
| 4,353,035 | 10/1982 | Schroder | .......................... | 333/14 X |
| 4,363,006 | 12/1982 | Ishigaki et al. | ................... | 455/72 X |
| 4,376,916 | 3/1983 | Glaberson | .......................... | 333/14 X |

Primary Examiner—Paul L. Gensler
Assistant Examiner—Benny Lee
Attorney, Agent, or Firm—Ladas & Parry

[57] ABSTRACT

A noise reducing apparatus consists of a compression system and an expansion system. The compression system comprises a pre-emphasis circuit for performing a pre-emphasis operation with respect to an input signal, a first variable gain control circuit for giving a level compression characteristic to an output signal of the pre-emphasis circuit, to produce an output signal to a transmission path, a first control voltage producing circuit for dividing the output signal of the first variable gain control circuit into a plurality of bands, to produce a plurality of control voltages respectively given mutually different bands, a first weighting circuit for respectively and relatively weighting the plurality of control voltages obtained from the first control voltage producing circuit, and a first adding circuit for adding the plurality of control voltages obtained from the first weighting circuit, to obtain a first control voltage and apply this first control voltage to the first variable gain control circuit. The expansion system similar to the compression system, comprises a second variable gain control circuit for giving a level expansion characteristic to the level compressed signal obtained through the above transmission path, where the level expansion characteristic is complementary to the level compression characteristic.

5 Claims, 11 Drawing Figures

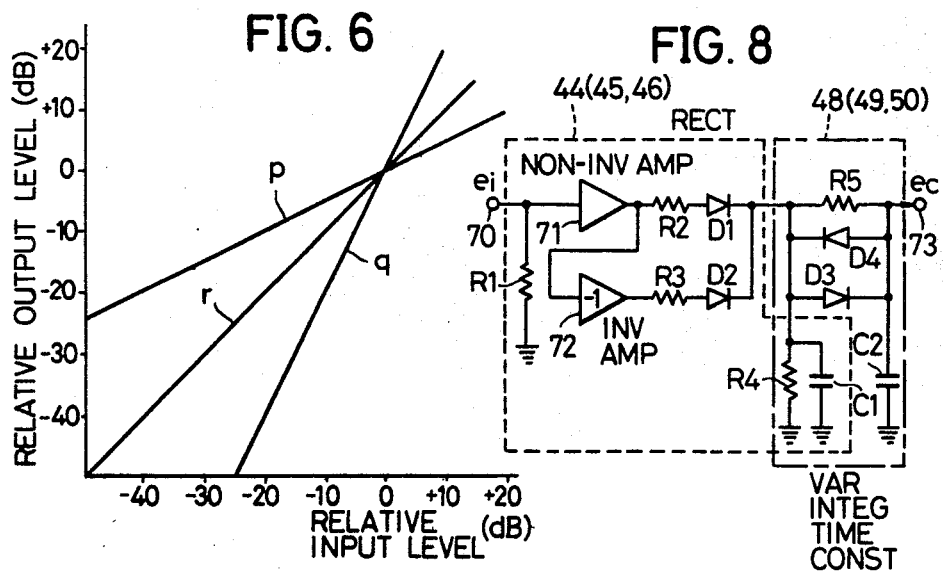
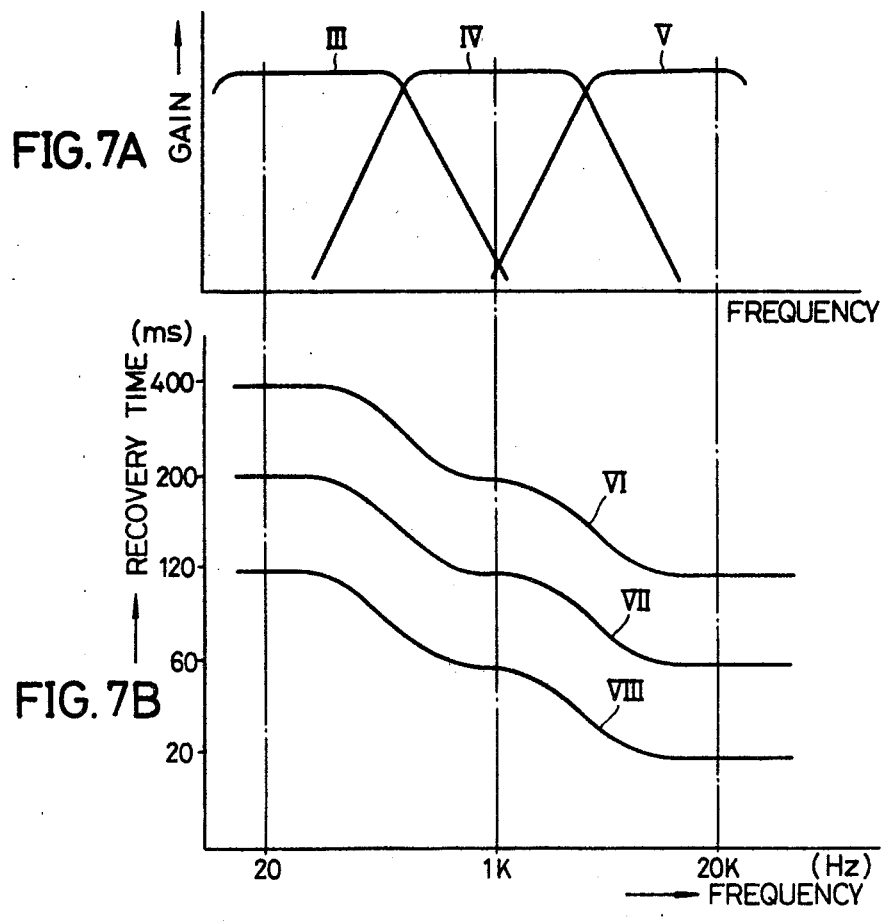

NOISE REDUCING APPARATUS

BACKGROUND OF THE INVENTION

The present invention generally relates to noise reducing apparatuses, and more particularly to a noise reducing apparatus capable of preventing generation of noise modulation phenomenon, generally referred to as breathing, when reducing noise by compression and expansion of signal levels.

Conventionally, noise reducing apparatuses have been known which perform compression of the signal level, and expansion of the signal level complementary to the signal level compression, in order to reduce noise (hiss noise and the like) introduced upon reproduction of a magnetic recording medium in a magnetic recording and/or reproducting system. These known noise reducing apparatuses were used for reducing noise (surface noise and the like) introduced upon tracing of a record disc during reproduction in a recording and reproducing system for the record disc, and further used for improving degradation introduced in a ratio between receiving signal level and receiving noise level (signal-to-noise ratio, or simply S/N ratio) upon long-distance signal reception and the like in the field of signal transmission and reception of radio broadcasting.

The above type of a noise reducing apparatus generally comprises a level compression circuit having a variable gain control circuit supplied with an input signal and a control loop circuit which produces a control voltage for controlling an output signal of the variable gain control circuit to control the gain of the variable gain control circuit, and a level expansion ciruit having a variable gain control circuit supplied with a recorded and reproduced (or transmitted and received) signal and a control loop circuit for controlling the gain of this variable gain control circuit within the level expansion circuit. The noise within the level compressed signal applied to the level expansion circuit is subjected to level modulation by the level expansion circuit, since the control voltage level varies according to a level expansion characteristic in accordance with the level variation in the level compressed signal. Therefore, noise modulation phenomenon was introduced in the output of the level expansion circuit.

Hence, in the above conventional noise reducing apparatus, degradation is introduced in the auditory fidelity if the level modulated noise obtained from the level expansion circuit is not masked by the signal level.

The above noise modulation phenomenon is closely related to the recovery time of the level expansion circuit. Generally, when the recovery time is long, the noise modulation phenomenon is easily notable and unpleasant to the ear. On the other hand, when the recovery time is short, the noise is masked and hardly detected by the ear. Accordingly, the noise modulation phenomenon can be improved by reducing the above recovery time. However, there is a limit in reducing the recovery time, since it is necessary to prevent the distortion factor in the level compressed and expanded signal from becoming worse due to a ripple component included within the control voltage at the lowermost signal frequency where the signal compression and expansion is performed. Therefore, there was a disadvantage in the conventional noise reducing apparatus in that it was difficult to greatly improve the noise modulation phenomenon.

Thus, as one method of improving the noise reducing apparatus with respect to the above problems, one of the present inventors has proposed an improved noise reducing apparatus in a U.S. patent application Ser. No. 297,106 filed on Aug. 28, 1981 entitled "NOISE REDUCING APPARATUS". In the proposed noise reducing apparatus, the output signal of the variable gain control circuit in the level compression circuit and the input signal of the variable gain control circuit in the level expansion circuit are respectively divided into low and high frequency bands, within the respective control loop circuit in the level compression circuit and the level expansion circuit. The control voltages are produced for every signal in each of the divided bands, and these control voltages are added. The previously proposed noise reducing apparatus thus used a band dividing and adding method.

For example, the control loop in the level compression circuit of the above previously proposed noise reducing apparatus comprises a lowpass filter and a highpass filter supplied with the output signal of the variable gain control circuit, rectifying circuits respectively connected to each filter, an integration time constant circuit for the low frequency band and an integration time constant circuit for the high frequency band respectively connected to each rectifying circuit, and a circuit for adding outputs of the two integration time constant circuits to supply a voltage to the above variable gain control circuit in order to control the gain of the variable gain control circuit. The control loop in the level expansion circuit has a similar circuit construction as the above control loop in the level compression circuit. However, the input signal of the control loop in the level expansion circuit is a signal which is transmitted and applied to the variable gain control circuit in the level expansion circuit, after being recorded and reproduced (or transmitted and received). The signals which are banddivided at the two filters are converted into control voltages corresponding to their respective envelopes, by being passed through the rectifying circuits and the integration time constant circuits.

However, in the above previously proposed noise reducing apparatus, when the level compression and level expansion are simply performed with a flat frequency characteristic, there is a problem in that the noise modulation phenomenon due to noise distributed in the high band is not reduced.

Accordingly, as an apparatus for solving the above problem, an apparatus may be considered in which the level compression is performed after performing pre-emphasis with respect to the input signal within the level compression circuit, and the level expansion is performed after performing de-emphasis with respect to the signal within the expansion circuit. Generally, in the compression and expansion circuits to which the above pre-emphasis and de-emphasis circuits are to be applied, the control voltage generating loop is provided with a weighting circuit having a weighting characteristic closely resembling the emphasis characteristic, at a stage before the rectifying circuit. That is, a level difference corresponding to the emphasis characteristic, is given between the output signal levels of the lowpass filter and the highpass filter.

However, in this apparatus what can be considered a balance cannot be obtained with respect to the relationship between the attack time and the recovery time of the integration time constant circuit for the low frequency band and the attack time and the recovery time of the integration time constant circuit for the high frequency band. Hence, it becomes difficult to set the desired integration time constant. Moreover, there is a disadvantage in that sufficient effect cannot be obtained in reducing the noise modulation phenomenon.

Detailed description will be given on why sufficient effect cannot be obtained in reducing the noise modulation in the above apparatus which can be considered. The above rectifying circuits and the integration time constant circuits are constructed so that an input signal $e_i$ is rectified and integrated at a circuit comprising a resistor $R_1$, an internal resistance $R_{dF}$ of a rectifying diode D, a resistor $R_2$, and a capacitor C. During the positive half wave of the input signal $e_i$, a current flows to the capacitor C, through the resistor $R_1$ and the internal resistance $R_{dF}$ of the diode D in a series manner, to charge the capacitor C. On the other hand, during the negative half wave of the input signal $e_i$, the electrical charge stored in the capacitor C is discharged through the resistor $R_2$ connected in parallel with the capacitor C. Hence, during the negative half wave of the input signal $e_i$, a control voltage $E_c$ is generated between terminals of the resistor $R_2$.

The forward voltage $V_F$ versus forward current $I_F$ characteristic of the diode D shows a characteristic wherein the voltage $V_F$ and the current $I_F$ is proportional over a predetermined voltage. Accordingly, with respect to a signal current $i_{dF}$ flowing through the diode D, the characteristic of the internal resistance $R_{dF}$ is a characteristic wherein the current $i_{dF}$ and the resistance $R_{dF}$ is proportional over a predetermined current. Thus, an attack time $T_a$ of the above rectifying and integrating time constant circuits becomes equal to the charging time constant of the capacitor C, and can be described by the following equation (1).

$$T_a = (R_1 + R_{dF}) \cdot C \qquad (1)$$

Moreover, a recovery time $T_r$ becomes equal to the discharging time constant of the capacitor c, and can be described by the following equation (2).

$$T_r = R_2 \cdot C \qquad (2)$$

Therefore, the attack time $T_a$ is affected by the internal resistance $R_{dF}$ of the diode D. As described above, this internal resistance $R_{dF}$ varies according to the magnitude of the signal current $i_{dF}$ flowing through the diode D in the forward direction. The attach time $T_a$ is short when the input signal level is high, and long when the input signal level is low, and is substantially inversely proportional with respect to the level of the input signal $e_i$. On the other hand, as shown in the above equation (2), the recovery time $T_r$ assumes a constant value regardless of the level of the input signal $e_i$.

When the circuit is constructed to give a level difference between the output signal levels of the lowpass filter and the highpass filter, the following relation indicated by the equation (3) is obtained, according to the non-linear characteristic of the rectifying diodes and the equations (1) and (2). In the equation (3), $T_{aL}$ and $T_{rL}$ respectively indicate the attack time and recovery time of a circuit supplied with the output signal of the lowpass filter, and $T_{aH}$ and $T_{rH}$ respectively indicate the attack time and recovery time of a circuit supplied with the output signal of the highpass filter.

$$\frac{T_{aL}}{T_{rL}} \neq \frac{T_{aH}}{T_{rH}} \qquad (3)$$

The above equation (3) indicates that the ratios between the attack time and the recovery time in the circuit supplied with the output signal of the lowpass filter and the circuit supplied with the output of the highpass filter become unequal. Accordingly, the relationship between the attack time with respect to the desired recovery time becomes complicated according to the non-linear characteristic of the rectifying diode. Thus, it becomes difficult to set the integration time constant. The integration time constant is closely related to the noise modulation phenomenon, and as a result, this noise reducing apparatus which can be considered had a disadvantage in that an expected effect could not be obtained in improving the noise modulation phenomenon.

SUMMARY OF THE INVENTION

Accordingly, it is a general object of the present invention to provide a novel and useful noise reducing apparatus in which the above described disadvantages have been overcome.

Another and more specific object of the present invention is to provide a noise reducing apparatus in which a pre-emphasis circuit and a de-emphasis circuit are respectively provided within a level compression circuit and a level expansion circuit, and further a loop circuit for producing a control voltage with respect to a variable gain control circuit has a circuit construction so that the signal supplied to the loop circuit is divided into a plurality of frequency bands, rectified for each frequency band, weighted, and then, the output signals in each frequency band are added to obtain a control voltage. According to the apparatus of the present invention, the mid and high frequencies are intensified when the signal level is low, and the signal level versus noise level ratio in the mid and high frequencies is increased with respect to the noise introduced in the transmission path. This and other factors contribute to vast improvement in the noise modulation phenomenon. Furthermore, in a level range where the level compression characteristic or the level expansion characteristic in the high and low bands coincide, the integration time constants in the high and low bands can be set with ease, since the above attack time $T_{aH}$ and the recovery time $T_{rH}$ become equal. Therefore, it becomes possible to more effectively improve the noise modulation phenomenon.

Other objects and further features of the present invention will be apparent from the following detailed description when read in conjunction with the accompanying drawings.

BRIEF DESCRIPTION OF THE DRAWINGS

FIG. 6 shows input signal level versus output signal level characteristics of the apparatus shown in FIG. 5;

FIGS. 7A and 7B respectively show frequency characteristics and recovery time characteristics at each part of the apparatus shown in FIG. 5; and FIG. 8 is a circuit diagram showing an embodiment of a concrete circuit of an essential part of the apparatus shown in FIG. 5.

DETAILED DESCRIPTION

Figure 1:
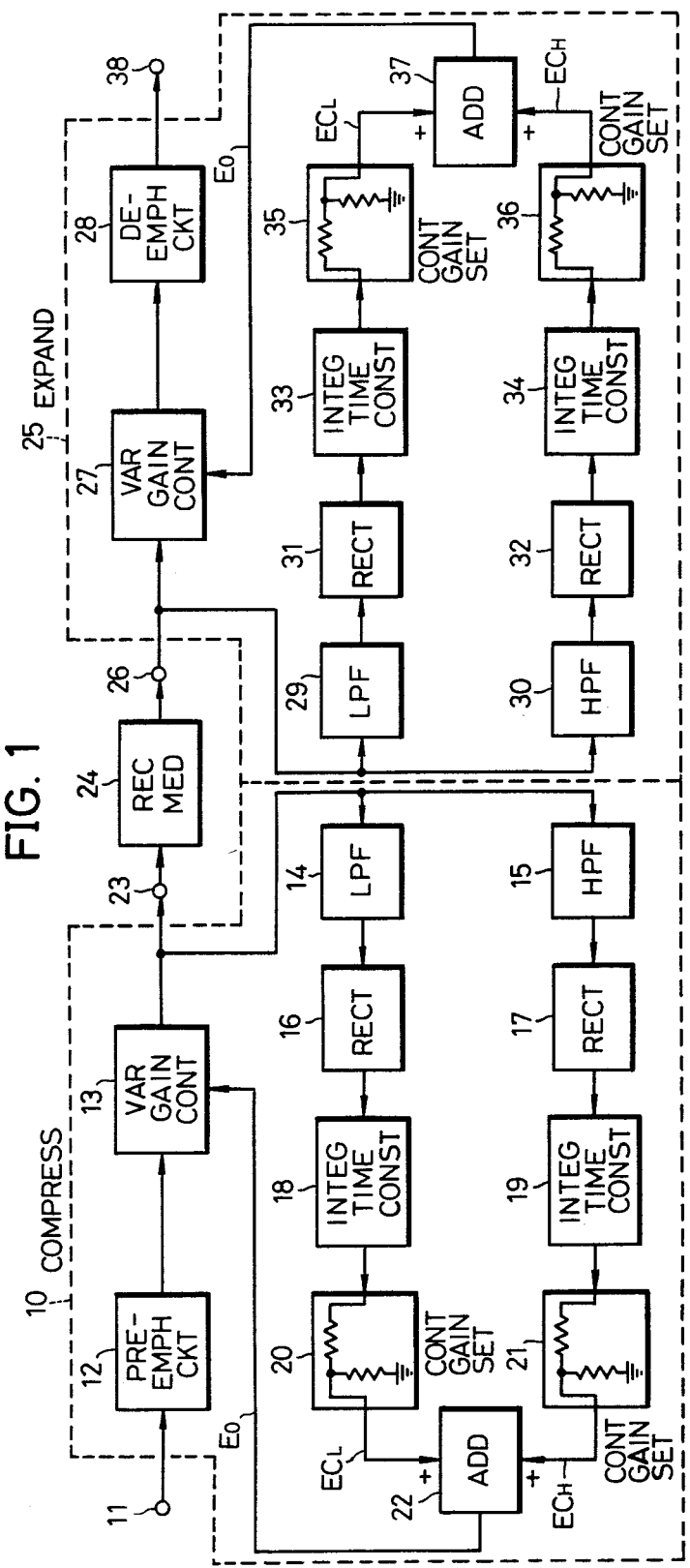
FIG. 1 is a system block diagram showing an embodiment of a noise reducing apparatus according to the present invention.

An embodiment of a noise reducing apparatus according to the present invention will be described in conjunction with FIG. 1. In FIG. 1, a circuit part 10 surrounded by a dotted line, between an input terminal 11 and an output terminal 23, is a level compression circuit and has level compression characteristics indicated by a and c in FIG. 3. A circuit part 25 surrounded by a dotted line, between an input terminal 26 and an output terminal 38, is a level expansion circuit and has level expansion characteristics indicated by b and d in FIG. 3. The characteristics b and d are symmetrical to the characteristics a and c, with respect to a straight line e which is the characteristic when the input and output levels are the same. That is, the characteristics b and d are selected so as to be complementary to the characteristics a and c.

Figure 2:
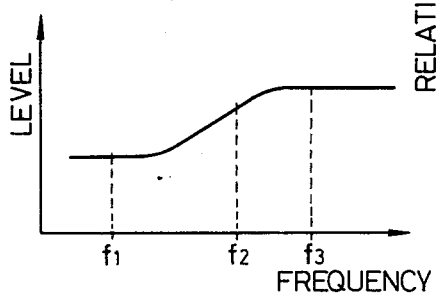
FIG. 2 shows an example of the characteristic of a pre-emphasis circuit within the block system shown in FIG. 1.
Figure 4A:
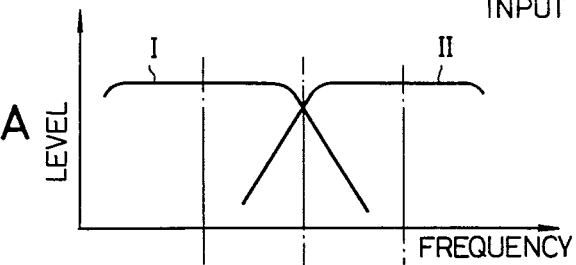
FIGS. 4A, 4B, and 4C respectively show characteristics of circuits at each part of the apparatus shown in FIG. 1.

An input signal such as an audio signal applied to the input terminal 11, is supplied to a pre-emphasis circuit 12 having a characteristic indicated in FIG. 2. The signal level in the higher frequency is relatively intensified compared to the signal level in the lower frequency, at the above pre-emphasis circuit 12. An output signal of the preemphasis circuit 12 is produced at the output terminal 23 through a variable gain control circuit 13, while the output of the variable gain control circuit 13 is also supplied to a lowpass filter 14 and a highpass filter 15. The lowpass filter 14 has a characteristic I indicated in FIG. 4A, for passing signal components equal to or lower than a frequency $f_2$. The highpass filter 15 has a characteristic II indicated in FIG. 4A, for passing signal components equal to or higher than the frequency $f_2$.

An output signal of the lowpass filter 14 is supplied to an integration time constant circuit 18 through a rectifying circuit 16. The output signal of the lowpass filter 14 is accordingly converted into a control voltage given an integration time constant $TC_1$. The output control voltage of the circuit 18 is supplied to a low band control gain setting circuit 20 wherein a low band contol gain $G_L$ is set, and a low band control voltage $EC_L$ is obtained. On the other hand, an output signal of the highpass filter 15 is supplied to an integration time constant circuit 19 through a rectifying circuit 17. The output signal of the highpass filter 15 is converted into a control voltage given an integration time constant $TC_3$. The output control voltage of the circuit 19 is supplied to a high band control gain setting circuit 21 wherein the signal is formed into a high band control voltage $EC_H$. The above integration time constants $TC_1$ and $TC_3$ are set to time periods which are minimized to an extent without introducing increase in the distortion rate of the control voltage due to ripple. The control gain setting circuits 20 and 21 respectively comprise an attenuating circuit simply having resistors, and the resistance is selected according to the weighting.

In correspondence with the above pre-emphasis characteristic, the low band control voltage $EC_L$ given the weighting $G_L$ and the high band control voltage $EC_H$ given the weighting $G_H$ are added at an adding circuit 22. An output control voltage $E_o$ of the adding circuit 22 is supplied to the variable gain control circuit 13, to control the gain of the variable gain control circuit 13. The output signal of the pre-emphasis circuit 12 is subjected to level compression at the variable gain control circuit 13, and then obtained through the output terminal 23. This output signal obtained through the output terminal 23 is recorded onto a recording medium 24.

Figure 4B:
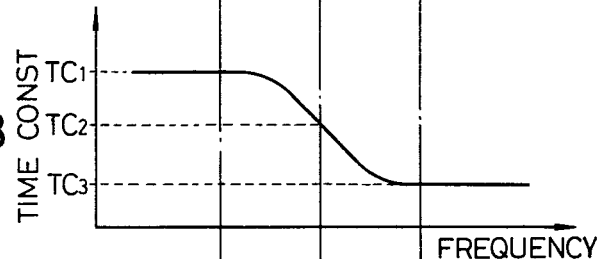

Accordingly, in the control system, the band is divided into the low band and the high band, the low band integration time constant $TC_1$ and the high band integration time constant $TC_3$ are given, and the respective control voltages $EC_L$ and $EC_H$ are added. Thus, as indicated in FIG. 4B, an integration time constant $TC_2$ having a value between the time constants $TC_1$ and $TC_3$ is formed at the frequency $f_2$. The control time constant varies in accordance with the variation in the input signal frequency.

Figure 3:
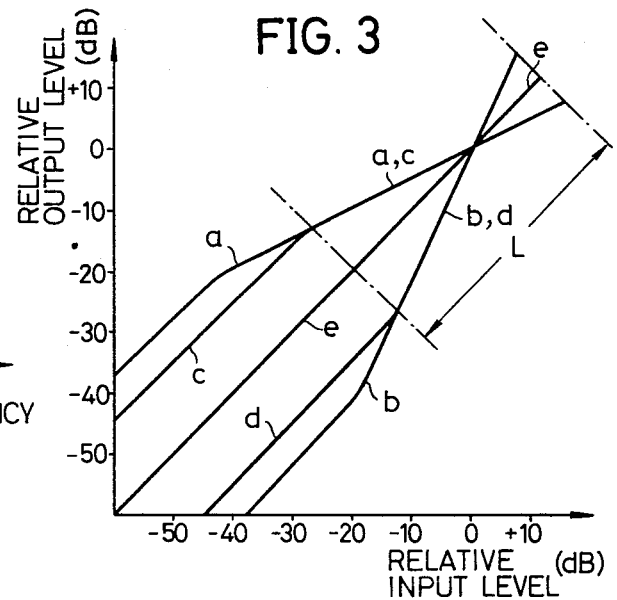
FIG. 3 shows input level versus output level characteristic of the apparatus shown in FIG. 1.
Figure 4C:
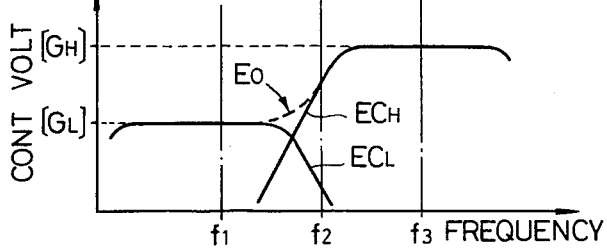

FIG. 4C indicates characteristics of the low band control voltage $EC_L$, the high band control voltage $EC_H$, and the control voltage $E_o$ obtained by adding these control voltages Therefore, the level compression characteristic obtained by the above level compression circuit 10 becomes as indicated by a for the high frequency components and as indicated by c for the low frequency components in FIG. 3.

As indicated in FIG. 3, the above characteristics a and c coincide within a range L. Hence, the levels of the signals respectively supplied to the rectifying circuits 16 and 17 coincide within the range L. The following equation (4) thus stands.

$$\frac{T_{aL}}{T_{rL}} = \frac{T_{aH}}{T_{rH}} \quad (4)$$

Accordingly, it becomes easy to set the integration time constants in the low and high bands, and is effective in improving the noise modulation phenomenon which is closely related to the integration time constants.

Next, description will be given with respect to the operation of the level expansion circuit 25. A level compressed signal reproduced from the recording medium 24 is applied to the input terminal 26. This input signal is supplied to a variable gain control circuit 27, and also supplied to a lowpass filter 29 and a highpass filter 30.

An output signal of the lowpass filter 29 successively passes through a rectifying circuit 31, an integration time constant circuit 33, and a low frequency band control gain setting circuit 35, to be converted into a low frequency band control voltage $EC_L$, and then supplied to an adding circuit 37. An output signal of the highpass filter 30 successively passes through a rectifying circuit 32, an integration time constant circuit 34, and a high band control gain setting circuit 36, to be converted into a high band control voltage $EC_H$, and then supplied to the adding circuit 37.

The circuit in the control system, comprising the circuits 29 through 37, is of the same construction as the circuit in the control system, comprising the circuits 14 through 22, within the level compression circuit 10. Hence, the circuit in the control system within the level expansion circuit 25 has the same characteristic as the circuit in the control system within the level compression circuit 10. The low frequency band control voltage $EC_L$ and the high frequency band control voltage $EC_H$ which are respectively supplied to the adding circuit 37, have the same characteristics as those indicated in FIG. 4C for the control voltages $EC_L$ and $EC_H$. Accordingly, a control voltage $E_o$ obtained by adding these control voltages has the same characteristic as that indicated by $E_o$ in FIG. 4C.

The above control voltage $E_o$ is supplied to the variable gain control circuit 27, to control the gain of the variable gain control circuit 27. The variable gain control circuit 13 within the level compression circuit 10 performs an inversely proportional control (compression) operation, but the variable gain control circuit 27 within the level expansion circuit 25 performs a proportional (expansion) operation. The output signal of the variable gain control circuit 27 is obtained from the output terminal 38, through a de-emphasis circuit 28 having a transfer function which is an inverse function of the transfer function of the pre-emphasis circuit 12.

Accordingly, as indicated in FIG. 3, the level expansion characteristics b and d are respectively given for high and low frequencies, at the level expansion circuit 25. The level compressed signal described above is applied to the input terminal 26. As a result, a signal having a characteristic in which the input level and the output level are the same as indicated by the straight line e in FIG. 3, is obtained at the output terminal 38. That is, the signal obtained from the output terminal 38 is a signal equivalent to the input signal applied to the input terminal 11, and reduced of the noise which was generated in the transmission path.

It is clearly understood that a relationship identical to that described by the equation (4) stands with respect to the rectifying circuits 31 and 32 within the level expansion circuit 25. As described above, a variable emphasis operation is performed by the pre-emphasis circuit 12, the low band control gain setting circuit 20, and the high band control gain setting circuit 21 and the mid and high bands are intensified when the level of the signal is low. Thus, the S/N ratio is increased in the mid and high band with respect to the noise level introduced upon recording and reproduction of the recording medium 24, and the noise modulation phenomenon is vastly improved.

Figure 5:
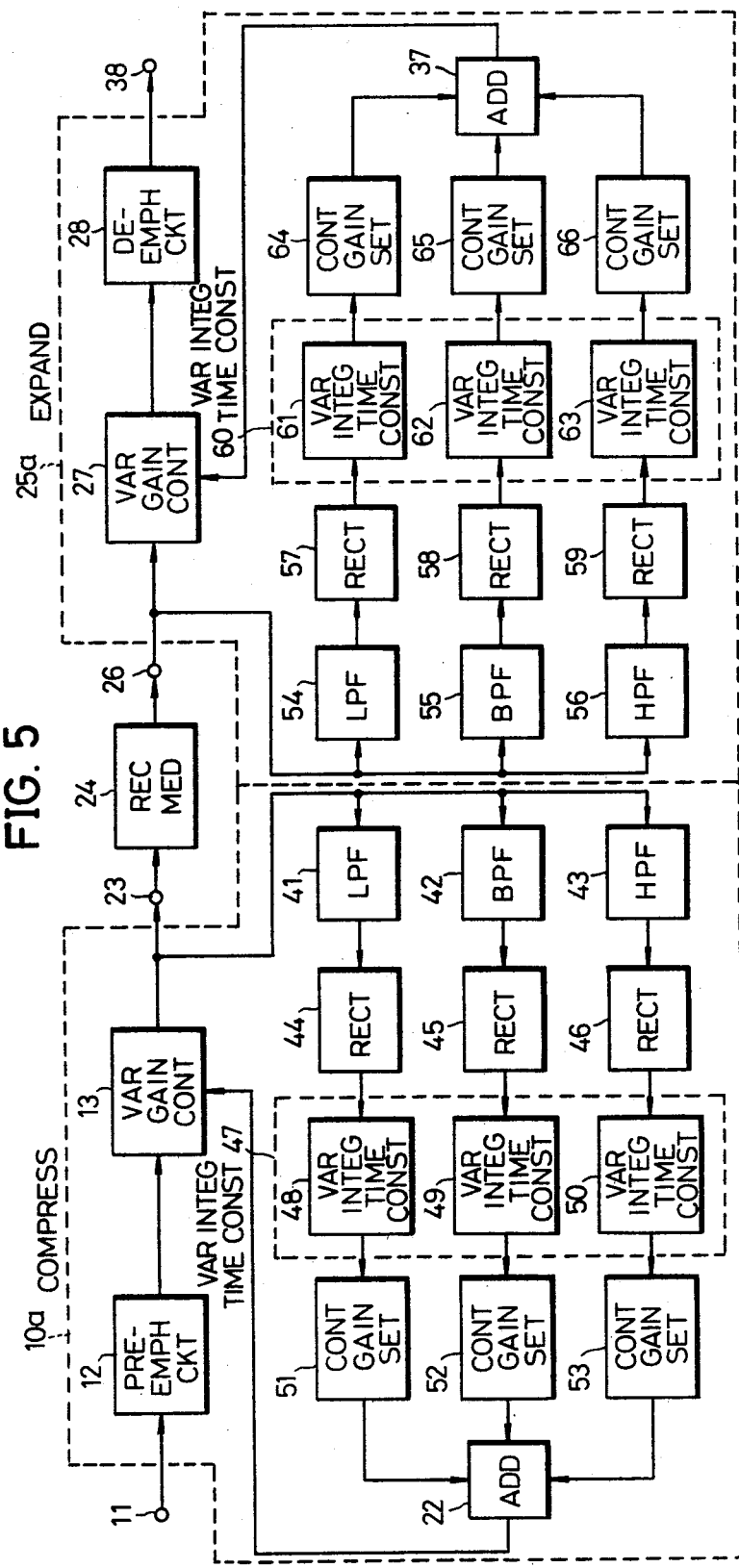
FIG. 5 is a system block diagram showing another embodiment of a noise reducing apparatus according to the present invention.

Next, description will be given with respect to another embodiment of a noise reducing apparatus according to the present invention, by referring to FIG. 5. In FIG. 5, those parts which are the same as those corresponding parts in FIG. 1 are designated by the same reference numerals, and their description will be omitted. The differing points between the present embodiment and the above described embodiments are that, while the control voltage generating loop is divided into two systems for the high and low frequency bands in the above described embodiment, in the present embodiment, the control voltage generating loop is divided into three systems for high, mid, and low frequency bands. Further, a circuit corresponding to the integration time constant circuits in the above described embodiment, is a variable integration time constant circuit.

A level compression circuit 10a has a characteristic indicated by p in FIG. 6. A level expansion circuit 25a has a characteristic q indicated in FIG. 6, which is symmetrical with respect to the characteristic p.

In the level compression circuit 10a, the output of the variable gain control circuit 13 is produced at the output terminal 23. This output of the variable gain control circuit 13 is also supplied to a lowpass filter 41, a bandpass filter 42, and a highpass filter 43 respectively having filtering characteristics indicated by III, IV, and V in FIG. 7A, and the signal is band divided. Output signals of the filters 41, 42, and 43 are rectified by respective rectifying circuits 44, 45, and 46, and then supplied to respective variable integration time constant circuits 48, 49, and 50 within a variable integration time constant circuit part 47. Thus, the signals from the filters 41, 42, and 43 are given different time constants at the respective circuits 48, 49, and 50, according to their signal level.

An embodiment of a concrete circuit construction of the rectifying circuit 44 (45 and 46) and the variable integration time constant circuit 48 (49 and 50) is shown in FIG. 8. The output of the filter 41 (42 and 43) is supplied to a non-inverting amplifier 71 within the rectifying circuit 44 (45 and 46), through an input terminal 70 where a resistor $R_1$ is connected between an input side of this non-inverting amplifier 71 and ground. A series connection consisting of a resistor $R_2$ and a diode $D_1$ and a series connection consisting of an inverting amplifier 72, a resistor $R_3$ and a diode $D_2$, are connected in parallel with respect to an output side of the amplifier 71. The variable integration time constant circuit 48 (49 and 50) comprises a circuit having a resistor $R_5$ and diodes $D_3$ and $D_4$ connected in parallel between the rectifying circuit 44 (45 and 46) and an output terminal 73, a parallel connection consisting of a resistor $R_4$ and a capacitor $C_1$ connected between an input side of the above circuit and ground, and a capacitor $C_2$ connected between an output side of the above circuit and ground. The diodes $D_3$ and $D_4$ are connected in parallel facing mutually opposite directions. Furthermore, the resistor $R_5$ is connected to provide a DC connection, and has a high resistance of over several hundred k$\Omega$. A voltage between terminals of the capacitor $C_2$ is obtained as a control voltage $e_c$ from the terminal 73.

An input signal $e_i$ applied to the input terminal 70 is amplified by non inverting amplifier 71. During the positive half wave of the input signal $e_i$, a current flows to the capacitor $C_1$ through the resistor $R_2$ and the diode $D_1$ to charge the capacitor $C_1$. Further, a current flows to the capacitor $C_2$ through the diode $D_3$, to charge this capacitor $C_2$. During the succeeding half wave of the input signal, the capacitor $C_1$ is charged through the inverting amplifier 72, the resistor $R_3$ and the diode $D_2$. Moreover, the capacitor $C_2$ is simultaneously charged through the diode $D_3$. The operation time (attack time) is a time required until the charging of the capacitor $C_2$ is completed, by the increase introduced in the level of the input signal $e_i$. This attack time is determined by values of the resistor $R_2$, an internal resistance $R_{d1}$ of the diode $D_1$, the resistor $R_3$, an internal resistance $R_{d2}$ of the diode $D_2$, the capacitor $C_1$, an internal resistance $R_{d3}$ of the diode $D_3$, and the capacitor $C_2$. The attack time is substantially proportional to each of the internal resistances $R_{d1}$ through $R_{d3}$.

On the other hand, when the signal level of the input signal $e_i$ is rapidly decreased, the electrical charge stored in the capacitor $C_2$ is discharged through the diode $D_4$ and the resistor $R_4$ in a series manner. Hence, the voltage to which the capacitor $C_2$ is charged (that is a control voltage $e_c$) is gradually attenuated. The time required until this discharge is completed, is the recovery time. This recovery time is determined by values of the capacitor $C_2$, an internal resistance $R_{d4}$, and the resistor $R_4$, and is proportional to the value of the internal resistance $R_{d4}$.

The internal resistance of the diode shows a characteristic in which the resistance decreases as the forward current increases, as is well known. On the other hand, as the signal level of the input signal $e_i$ increases, the current flowing to the diodes $D_1$ through $D_3$ or the diode $D_4$ increases. Accordingly, the above attack time and the recovery time become long when the signal level of the input signal $e_i$ is low since the internal resistances $R_{d1}$ through $R_{d4}$ of the diodes are large, and become short when the input signal level is high.

The three control voltages thus obtained from the variable integration time constant circuits 48, 49, and 50, are control voltages respectively given time constants which vary according to the signal level in their respective frequency bands. These control voltages are respectively supplied to control gain setting circuits 51, 52, and 53, and subjected to weighting in respective bands as in the above described embodiment. The control gain setting circuits 51 through 53 are added at the adding circuit 22, to form a control voltage $E_c$. This control voltage $E_c$ is applied to the variable gain control circuit 13. The control voltage $E_c$ is given a time constant which varies according to the change in the frequency of the input signal, and is also a control voltage given a time constant which varies according to the change in the signal level of the input signal. The control voltage $E_c$ has a recovery time characteristic indicated in FIG. 7B. In FIG. 7B, a curve VI indicates a recovery time characteristic for a case where the signal level of the input signal applied to the input terminal 21 rapidly decreases from $-10$ dB to $-30$ dB, with 0 dB as the reference. On the other hand, a curve V indicates a recovery time characteristic for a case where the above signal level rapidly decreases from 0 dB to $-20$ dB. A curve VI indicates a recovery time characteristic for a case where the above signal level rapidly decreases from $+10$ dB to $-10$ dB.

Similarly, in the level expansion circuit 25a, the signal from the terminal 26 is supplied to the variable gain control circuit 27 and also to a lowpass filter 54, a bandpass filter 55, and a highpass filter 56. Outputs of the filters 54, 55, and 56 are respectively supplied to rectifying circuits 57, 58, and 59. Outputs of these rectifying circuits 57, 58, and 59 respectively pass through respective variable integration time constant circuits 61, 62, and 63, and control gain setting circuits 64, 65, and 66, and are then added at the adding circuit 37. An output control voltage from the adding circuit 37 is applied to the variable gain control circuit 27 to control the gain of this variable gain control circuit 27.

According to the present embodiment of the invention, the level compression and expansion characteristics are not only given with integration time constants which vary according to the frequency of the input signal, but also with integration time constants which vary according to the signal level of the input signal. As a result, the noise modulation phenomenon can also be minimized from the auditory point of view. Moreover, the band may be divided into two or four, or even more than four bands.

Further, the present invention is not limited to these embodiments, but various variations and modifications may be made without departing from the scope of the present invention.

What is claimed is:

1. A noise reducing apparatus comprising:
a pre-emphasis circuit for performing a pre-emphasis operation with respect to an input signal;
a first variable gain control circuit for giving a level compression characteristic to an output signal of said pre-emphasis circuit, to produce an output signal to a transmission path;
a first control voltage producing circuit for dividing the output signal of said first variable gain control circuit into a plurality of frequency bands, to produce a plurality of control voltages respectively given mutually different integration time constants for each of the divided frequency bands;
a first weighting circuit for respectively and relatively weighting said plurality of control voltages obtained from said first control voltage producing circuit;
a first adding circuit for adding said plurality of control voltages obtained from said first weighting circuit, to obtain a first control voltage to be applied to said first variable gain control circuit;
a second variable gain control circuit for giving a level expansion characteristic to the level compressed signal obtained through said transmission path, said level expansion characteristic being complementary to said level compression characteristic;
a de-emphais circuit having a characteristic complementary to the pre-emphasis characteristic of said pre-emphasis circuit, for performing a de-emphasis operation with respect to an output signal of said second variable gain control circuit;
a second control voltage producing circuit for dividing the input signal of said second variable gain control circuit into a plurality of frequency bands, to produce a plurality of control voltages respectively given mutually different integration time constants for each of the divided frequency bands;
a second weighting circuit for respectively and relatively weighting said plurality of control voltages obtained from said second control voltage producing circuit; and
a second adding circuit for adding said plurality of control voltages obtained from said second weighting circuit, to obtain a second control voltage to be applied to the second variable gain control circuit.

2. A noise reducing apparatus as claimed in claim 1 in which said first weighting circuit performs weighting of DC gain according to the pre-emphasis characteristic of said pre-emphasis circuit, and said second weighting circuit performs weighting of DC gain according to the de-emphasis characteristic of said de-emphasis circuit.

3. A noise reducing apparatus as claimed in claim 1 in which each of said first and second control voltage producing circuits comprises a plurality of filters for dividing the input signal into a plurality of frequency bands, a plurality of rectifying circuits for rectifying output signals from each of said filters, and a plurality of integration time constant circuits for giving integration time constants to output signals from each of said rectifying circuits, and each of said first and second weighting circuits weights outputs from each of said integration time constant circuits.

4. A noise reducing apparatus as claimed in claim 3 in which the integration time constants of said integration time constant circuits are set to values which are minimized within a range in which degradation in the distortion rate of the control voltages in the divided bands due to ripple does not become objectionable.

5. A noise reducing apparatus as claimed in claim 3 in which said integration time constant circuits comprises variable integration time constant circuits which respectively vary the integration time constant according to the frequency and signal level of the output signals of said rectifying circuits.

* * * * *